United States Patent [19]

Blevins et al.

[11] Patent Number: 4,719,166

[45] Date of Patent: Jan. 12, 1988

[54] POSITIVE-WORKING PHOTORESIST ELEMENTS CONTAINING ANTI-REFLECTIVE BUTADIENYL DYES WHICH ARE THERMALLY STABLE AT TEMPERATURES OF AT LEAST 200° C.

[75] Inventors: Richard W. Blevins; Robert C. Daly, both of Rochester, N.Y.

[73] Assignee: Eastman Kodak Company, Rochester, N.Y.

[21] Appl. No.: 890,220

[22] Filed: Jul. 29, 1986

[51] Int. Cl.$^4$ .................. G03C 1/60; G03C 1/84
[52] U.S. Cl. ..................... 430/166; 430/191; 430/192; 430/270; 430/271; 430/510; 430/512
[58] Field of Search ............... 430/191, 166, 192, 270, 430/271

[56] References Cited

U.S. PATENT DOCUMENTS

| | | | |
|---|---|---|---|
| Re. 30,303 | 6/1980 | Weber, II et al. | 430/512 |
| 4,370,405 | 1/1983 | O'Toole et al. | 430/166 |
| 4,575,480 | 3/1986 | Kotani et al. | 430/192 |
| 4,618,565 | 10/1986 | White et al. | 430/166 |
| 4,626,492 | 12/1986 | Eilbeck | 430/166 |
| 4,668,606 | 5/1987 | DoMinh et al. | 430/166 |

OTHER PUBLICATIONS

Carlson, B., et al., "Control of One-Micron Lines in Integrated Circuits," *Proceedings of the Microelectronics Seminar*, 1980, pp. 109–113.

*Primary Examiner*—Charles L. Bowers, Jr.
*Assistant Examiner*—T. Stevenson
*Attorney, Agent, or Firm*—William J. Davis

[57] ABSTRACT

Positive-working photoresist elements are protected against reflection of activating radiation from the substrate by incorporation of certain butadienyl dyes in a photoresist layer, an anti-reflective layer or a planarizing layer. These dyes have superior resistance to thermal degradation or volatilization at temperatures of as high as 200° C. or more. The dyes also exhibit good solubility in solvents commonly employed in processing semiconductor devices, thus permitting the dyes to be incorporated in photoresist elements in an amount sufficient to prevent resist image distortion caused by backscattered or reflected light.

14 Claims, No Drawings

POSITIVE-WORKING PHOTORESIST ELEMENTS CONTAINING ANTI-REFLECTIVE BUTADIENYL DYES WHICH ARE THERMALLY STABLE AT TEMPERATURES OF AT LEAST 200° C.

FIELD OF THE INVENTION

This invention relates in general to photoresist elements and in particular to positive-working photoresist elements containing anti-reflective dyes. More specifically, this invention relates to positive-working photoresist elements having certain anti-reflective dyes incorporated therein which exhibit exceptionally high thermal stability and resistant to volatilization.

BACKGROUND OF THE INVENTION

A frequent problem encountered by resists used to process supports comprising semiconductor devices is reflectivity back into the resist of the activating radiation by the substrate, especially those containing highly reflective topographies. Such reflectivity tends to cause standing wave ripples and reflective notches, which degrade the resolution of the photoresist. Degradation of the microimagery in the processed resist is particularly bad when the support is non-planar and/or highly reflective. One approach to this problem is to incorporate an anti-reflective dye either in the photoresist layer or an adjacent layer.

Although there are many anti-reflective dyes known in the silver halide photography art, there are conditions peculiar to the photoresist art which render many such dyes unsuitable for use in photoresist elements. One of these is the high temperature baking that is given to the resist, prior to exposure. For example, it is common to force the resist layer, the anti-reflective layer, or the planarizing layer into a more planar configuration by baking it until it melts and flows, creating a condition known as "planarization." Such baking can require temperatures as high as 200° C. or more. High temperatures are deleterious unless great care is taken to select dyes which are non-volatile and thermally stable. Furthermore, dyes which might be expected to be non-volatile and thermally stable, such as very high molecular weight dyes, generally do not exhibit good solubility in solvents, such as chlorobenzene and ethoxyethyl acetate, which are commonly employed in processing semiconductor devices.

A problem with prior art anti-reflective dyes, known to be useful in anti-reflective coatings for use with photoresists, such as Sudan Orange G, described in *Proceedings of the Microelectronics Seminar*, 1980, pp. 109–113, is that such dyes are not resistant to volatilization when heated to temperatures of as high as 200° C. or more for 30 min., which is desirable for planarization.

SUMMARY OF THE INVENTION

This invention is based partly on the discovery that the photoresist elements of the invention, and particularly the anti-reflective dyes contained therein, have unexpected superior thermal stability and resistance to volatilization while being heated to temperatures of as high as 200° C. or more. The anti-reflective dyes, at the same time, surprisingly, exhibit good solubility in solvents, such as chlorobenzene and ethoxyethyl acetate, which are commonly employed in processing semiconductor devices. Accordingly, these dyes can be incorporated in a photoresist layer, an anti-reflective layer, or a planarizing layer in an amount sufficient to prevent resistant image distortion caused by backscattered or reflected light. These dyes also possess extraordinarily high extinction coefficients, are stable in solution at high concentrations for months at a time and do not crystallize when such solutions are evaporated to dryness.

More specifically, in accord with the present invention, there is provided a positive-working photosensitive element comprising a support, a layer on the support of a photosensitive compound responsive to activating radiation to provide increased solubility to selected solvents, and an anti-reflective dye disposed in the photosensitive layer or in a layer between the photosensitive layer and the support in an amount effective to absorb radiation reflected from the support. The element is improved in that the anti-reflective dye is a butadienyl dye having the following structural formula:

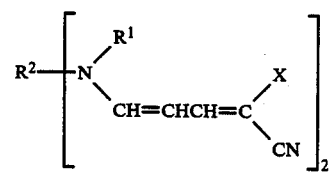

wherein
$R^1$ is alkyl, cycloalkyl or aryl;
$R^2$ is a linking group selected from the group consisting of arylene, alkylene and arylenealkylene wherein the linking group is optionally interrupted with one or more oxygen atoms or

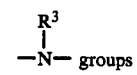

where
$R^3$ is alkyl;
provided that the sum of the carbon atoms for both $R^1$ groups plus the $R^2$ group is at least 13; and
X is an electron withdrawing group.

Thus, it is an advantageous feature of the invention that an anti-reflective layer is provided for a positive-working photosensitive element that can withstand the high heating conditions necessary for such an element.

It is another advantageous feature of the invention that such layer can be provided even at small thicknesses without the absorbing anti-reflective dye being lost due to volatilization.

It is still another advantageous feature of the invention that a positive-working, non-silver halide, photosensitive element is provided that is capable of excellent image resolution, particularly in the near- and mid-UV.

Other advantageous features will become readily apparent upon reference to the following description of the preferred embodiments.

DESCRIPTION OF THE PREFERRED EMBODIMENTS

The decription which follows concerns usage of the preferred embodiments as, or with, a positive-working photoresist composition that is coated onto a semiconductor support. Thus, as used herein "support" means any kind of substrate employed in processing semiconductor devices. The dye-containing layer is useful with planar supports as well as supports having non-planar features, particularly because layers of these elements are commonly planarized under such conditions by heating to 200° C. or more for a substantial length of time.

In a preferred embodiment, the dye-containing layer comprises a separate layer comprised of the dye and a suitable binder disposed between the support and the photosensitive layer. Such layer can be an anti-reflective layer or a planarizable layer.

An anti-reflective layer in accordance with this invention comprises an anti-reflective dye preferably having formula I above and a suitable binder. The anti-reflective layer preferably is imagewise removable and has a thickness no greater than about 5 μm. The anti-reflective layer can be disposed on the support surface, on a dye-containing planarizing layer of the type described herein, or on any other planarizing layer known to those skilled in the art.

A planarizing layer in accordance with this invention comprises an anti-reflective dye, preferably having formula I above, and a suitable binder that is capable of providing the desired planarization. Suitable binders include poly(acrylates), for example, poly(methyl methacrylates), polyamic acids, polyimides, novolacs, poly(hydroxystyrenes), and other homopolymers, copolymers, terpolymers, etc. known to those skilled in the art.

Alternatively, the photosensitive compound and the anti-reflective dye can be combined in a single layer. As such, the binder for the photosensitive compound is the only binder that is needed for both the photosensitive compound and the anti-reflective dye. The thickness of the single layer in this embodiment preferably does not exceed about 5 μm.

As noted above, any positive-working photosensitive composition is useful with the invention. Such positive-working compositions contain a positive-working, photosensitive compound, and optionally, a suitable binder. As used herein, a "positive-working photosensitive compound" means any compound, be it a polymer or not, which is responsive to activating radiation of any kind to produce a positive-working image after development of the resist. Thus, it includes those that respond to X-ray or E-beam radiation as well as those that respond to UV light. If the photosensitive compound is not a polymer, it is conventional practice to include a polymeric binder.

It will be readily apparent that the selection of such photosensitive compound depends upon the activating radiation of choice. Useful non-limiting examples of such photosensitive compounds include quinone diazide compounds and resins. Examples of these compounds are well known and are described in, for example, U.S. Pat. No. 4,141,733 issued Feb. 27, 1979 to Guild, the disclosure of which is hereby incorporated by reference.

Other useful photosensitive compounds include poly(methyl methacrylate-co-methacrylic acid) (mole ratio from 70/30 to 90/10) and the homopolymer of poly(methyl methacrylate) hereinafter "pmma".

The photoresist composition of the invention can optionally include a variety of conventional addenda, examples of which are readily obtainable from the literature.

In accordance with the invention, the anti-reflective layer is rendered thermally stable by reason of the fact that the dye has structural formula I above, wherein $R^1$ is alkyl, preferably containing from 1 to 12 carbon atoms, such as methyl, ethyl, propyl, butyl, hexyl and higher homologues and isomers thereof, cycloalkyl, preferably containing 5 or 6 carbon atoms; or aryl, preferably containing 6 to 10 carbon atoms such as phenyl or naphthyl. $R^1$ can be substituted with substituents such as cyano, alkoxy, and halo, which do not deleteriously affect the dye's thermal stability or solubility or interfere with the resist chemistry or IC manufacture.

$R^2$ in formula I above represents a linking group selected from the group consisting of arylene, preferably containing 6 to 10 carbon atoms, such as phenylene; alkylene, preferably containing from 1 to 12 carbon atoms such as methylene, ethylene, propylene, butylene, pentylene, hexylene and higher homologues thereof; and arylenealkylene, preferably containing from 7 to 12 carbon atoms. As noted, the linking group optionally is interrupted with one or more oxygen atoms such as, for example,

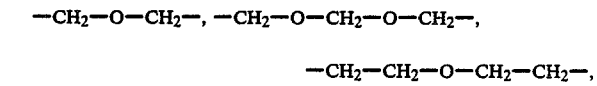

and the like, or one or more

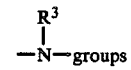

where $R^3$ is alkyl as defined for $R^1$ above. The linking group can be substituted with substituents as described for $R^1$ above.

X in formula I above represents an electron withdrawing group. Preferred electron withdrawing groups include CN,

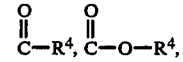

and $SO_2R^4$, where $R^4$ represents alkyl, preferably containing from 1 to 5 carbon atoms, such as methyl, or aryl, preferably containing 6 to 10 carbon atoms such as phenyl. The $R^4$ group does not affect the solubility of the dye as much as the $R^1$ and $R^2$ groups. In a particularly preferred embodiment, X represents CN.

It is contemplated that $R^2$ can represent the backbone of a polymer chain containing 2 or more

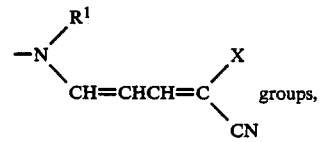

provided that such polymer is selected so as to be sufficiently soluble in solvents commonly employed in processing semiconductor devices.

The sum of the carbon atoms for both $R^1$ groups plus the $R^2$ group must be at least 13. The reason for this, as illustrated by the following examples, is that dyes containing fewer carbon atoms either do not exhibit good solubility in chlorobenzene and ethoxyethyl acetate or are not sufficiently thermally stable to resist degradation or volatilization at temperatures of 200° C.

The following are representative examples of specific useful anti-reflective dyes for use in or with a photosensitive layer:

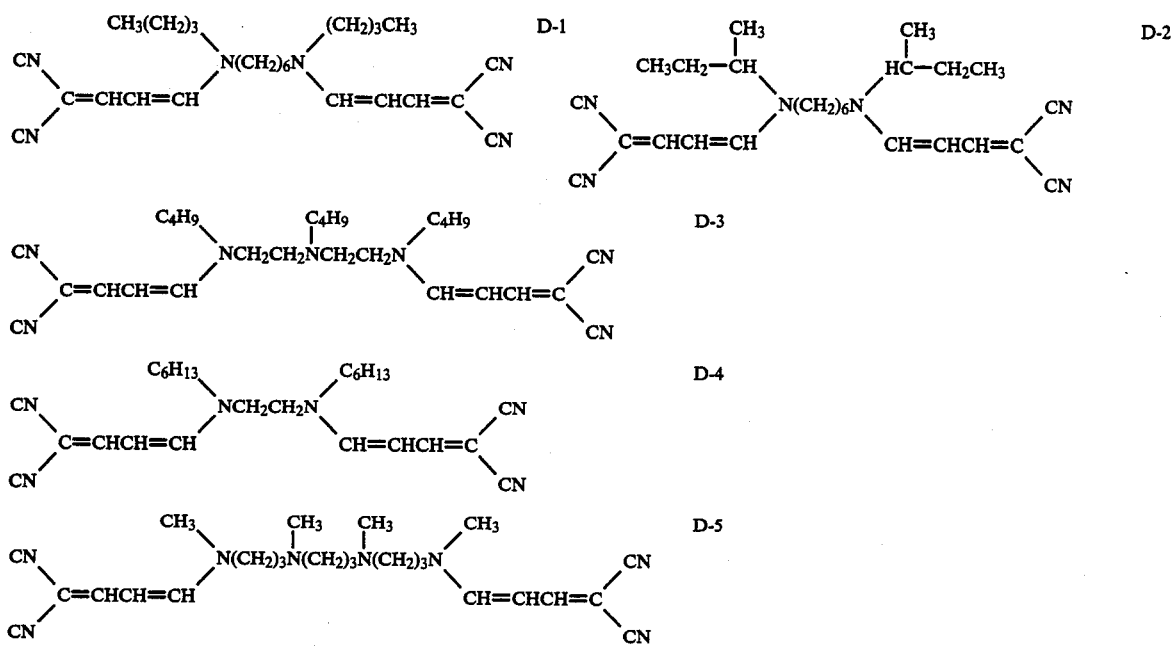

The anti-reflective dyes useful in the practice of this invention can be readily synthesized using conventional known practices. The following scheme is illustrative:

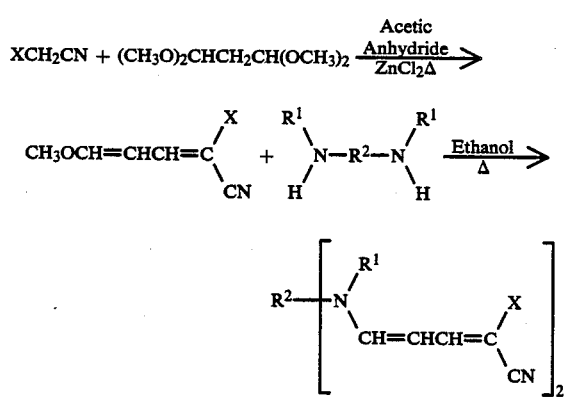

Specifically, N,N'-di-n-butyl-N,N'-di 1-(4,4-dicyano-1,3-butadiene)-1,6-hexanediamine (D-1) was synthesized as follows:

Preparation of 1-methoxy-4,4-dicyano-1,3-butadiene

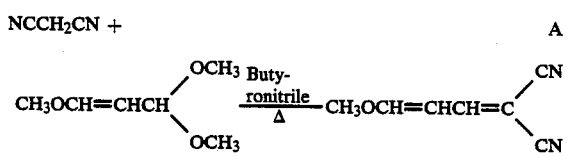

Malononitrile 132 g (2.0 moles), 1,3,3-trimethoxypropene 264 g (2.0 moles) and butyronitrile, 250 ml were combined and refluxed for one hour. The mixture was cooled to 0° C., then chilled in a dry ice/acetone bath for approximately 20 minutes. The product was collected using suction filtration while cold. The crude product was recrystallized twice from isopropanol.

Yield=47 g, 17% mp=70°–72° C. NMR and spectral analysis were consistent with structure.

Preparation of D-1

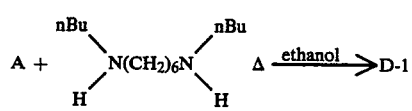

1-methoxy-4,4-dicyano-1,3-butadiene 1.2 g (0.0088 mole) was dissolved in 50 ml hot ethanol. Di-n-butyl-1,6-hexanediamine 1.0 g (0.0044 mole), diluted with 5 mL ethanol, was added dropwise over a 2 minute period. The reaction mixture was cooled to room temperature and the solid product was collected via suction filtration. The product was triturated with fresh ethanol, cooled and filtered. Yield=1.1 g, 58%, mp=125°–27° C. NMR was consistent with structure. % Found/Theory: N-19.4/19.4, C-72.3/72.2, H-8.2/8.4.

A wide variety of specific dyes is included within structural formula I. Due to the strong absorption spectra of these dyes in the near- and mid-UV (defined herein as wavelengths including the range 300–450 nm), it is preferred that such dyes be used in connection with near- or mid-UV emitting exposure sources. When used in conjunction with a conventional high pressure Hg source, which emits strongly at, for example, 365 nm, preferred dyes have a wavelength of maximum absorption, λ max, that varies between about 345 and 385 nm. Particularly preferred are those dyes having a λ max that is from 360 to 370 nm. Further, due to the minimal absorption of these dyes around 250 nm, they can be advantageously incorporated in pmma layers without altering the pmma performance.

The photoresist elements of this invention contain dyes which exhibit good solubility in solvents such as chlorobenzene and ethoxyethyl acetate. Chlorobenzene is most commonly used during the preparation and processing of elements comprising a polymer such as pmma. Ethoxyethyl acetate is most commonly employed in positive-working resist formulations comprising quinone diazide compounds and resins. The dyes, when finely powdered, generally require no heating to solubilize. Dissolution can be facilitated, however, by heating to 50° C. for up to 5 minutes.

The anti-reflective dyes useful herein can be incorporated into a photosensitive resist layer as follows: about 0.1 g of the anti-reflective dye is dissolved in about 10 g of a suitable resist formulation, such as Kodak Micropositive Resist 820, which comprises ethoxyethyl acetate as a solvent. This solution is spin coated on silicon or aluminum wafers, dried, exposed and developed. The images obtained from such a resist exhibit improved resolution compared to a control without the dye.

EXAMPLES

The following examples further illustrate the invention.

EXAMPLES 1-5

Anti-reflective Layers Containing Dyes Having Enhanced Thermal Resistance and Good Solubility Solutions of the anti-reflective dyes listed in Table I below were prepared by dissolving 1% by weight dye in a solution of 80 g ppma dissolved in 500 ml chlorobenzene. Examples 1-5 were all sufficiently soluble in both chlorobenzene and ethoxyethyl acetate, e.g. to the extent of at least 1% by weight dye, to permit the dye to be incorporated into an anti-reflective layer in an amount sufficient to prevent resist image distortion caused by backscattered or reflected light. The solutions so prepared were spin coated on 2"×2" quartz plates at 3000 RPM for 60 sec. The coatings were soft baked at 90°-100° C. for 20 min. in a forced air convection oven to remove the solvent, follwed by a hard bake at 200° C./30 min., which is desirable for planarization. % dye density loss was measured as being indicative of thermal stability and resistance to volatilization. Absorption spectra of the coating before and after the hard bake (200° C./30 min.) showed that, at the same concentration, heating at 200° C. has minimal effect on Examples 1-4, whereas heating caused a significant but still acceptable decrease in dye density with Example 5. D-1 and D-2 have molar extinction coefficients over 100,000 at 366 nm and exhibited excellent coating and handling properties.

Solutions prepared as described above were coated on an appropriate semiconductor substrate, dried, and then overcoated with a layer of a photosensitive resist material. The dye-containing anti-reflective layers of this invention smoothed uneven topographies and absorbed light passing through the resist, thus preventing image distortion caused by backscattered or reflected light.

TABLE I

| Example | Dye | Sum of Carbon Atoms for both R¹ groups plus the R² group | λ max, nm (pmma) | % Density Loss |
|---|---|---|---|---|
| 1 | D-1 | 14 | 378 | 1 |
| 2 | D-2 | 14 | 372 | 6 |
| 3 | D-3 | 16 | 370 | 5 |
| 4 | D-4 | 14 | 358 | 6 |
| 5 | D-5 | 13 | 365 | 35 |

Dyes C-1 and C-2, having the structures set forth below, have a sum of carbon atoms for both R¹ groups plus the R² group of 10 and 8, respectively. Thus, C-1 and C-2 are outside the scope of this invention. C-1 and C-2 were not sufficiently soluble in either chlorobenzene or ethoxyethyl acetate to permit such dyes to be incorporated into an anti-reflective layer in an amount sufficient to prevent substantial image distortion caused by backscattered or reflected light. C-1 and C-2, however, like D-1–D-4 exhibited resistance to volatilization.

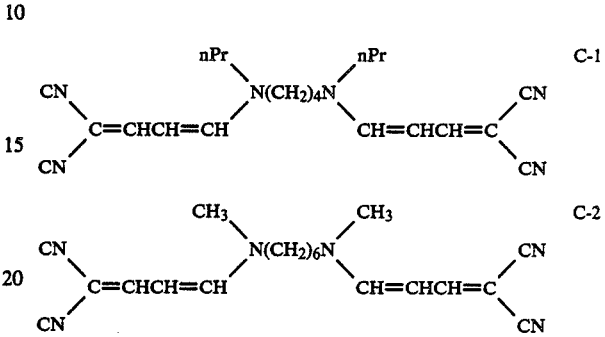

Dye C-3, having the structure set forth below, having a sum of carbon atoms for both R¹ groups plus the R² group of 10, was insoluble in both chlorobenzene and ethoxyethyl acetate.

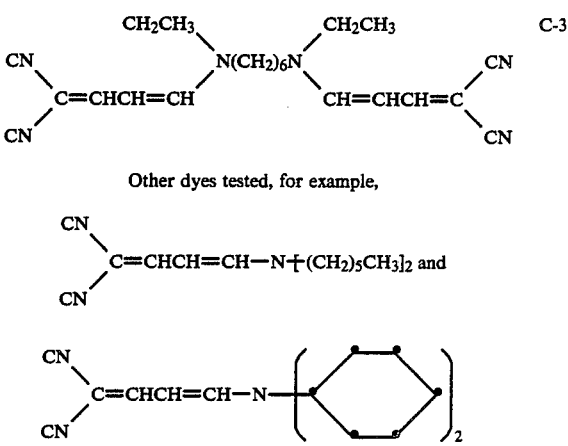

were soluble in chlorobenzene and ethoxyethyl acetate. Such dyes, however, when incorporated in anti-reflective layers and heated to 200° C. for 30 min. as described above, exhibited inferior thermal stability as compared to the dyes of this invention.

The invention has been described in detail with particular reference to preferred embodiments thereof, but it will be understood that variations and modifications can be effected within the spirit and scope of the invention.

What is claimed is:

1. In a positive-working photosensitive element comprising a support, a photosensitive layer on said support comprising a photosensitive compound responsive to activating radiation, which results in the photosensitive layer having increased solubility to selected solvents in the radiation exposed areas, and an anti-reflective dye disposed in a layer between said photosensitive layer and said support in an amount effective to absorb radiation reflected from said support, the improvement wherein said anti-reflective dye is a butadienyl dye having the structural formula:

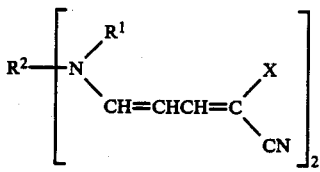

whereby said anti-reflective dye is thermally stable at temperatures of at least 200° C.,
wherein
R¹ is alkyl, cycloalkyl or aryl; and
R² is a linking group selected from the group consisting of arylene, alkylene and arylenealkylene and arylene, alkylene, and arylenealkylene interrupted with one or more oxygen atoms or

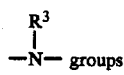

where
R³ is alkyl;
provided that the sum of the carbon atoms for both R¹ groups plus the R² group is at least 13; and
X is an electron withdrawing group.

2. The element of claim 1 wherein said layer containing said anti-reflective dye comprises poly(methyl methacrylate).

3. The element of claim 1 wherein said anti-reflective dye is selected from the group consisting of:

6. The element of claim 1 wherein X represents CN.

7. The element of claim 1 wherein said photosensitive compound comprises a quinone diazide.

8. A positive-working photosensitive element comprising a support, a photosensitive layer on said support comprising in admixture a photosensitive compound responsive to activating radiation, which results in the photosensitive layer having increased solubility to selected solvents in the radiation-exposed areas, and an anti-reflective dye disposed in said photosensitive layer in an amount effective to absorb radiation reflected from said support, characterized in that said anti-reflective dye is a butadienyl dye having the structural formula:

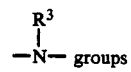

whereby said anti-reflective dye is thermally stable at temperatures of at least 200° C.,
wherein
R¹ is alkyl, cycloalkyl or aryl; and
R² is a linking group selected from the group consisting of arylene, alkylene and arylenealkylene and arylene, alkylene and arylenealkylene interrupted with one or more oxygen atoms or

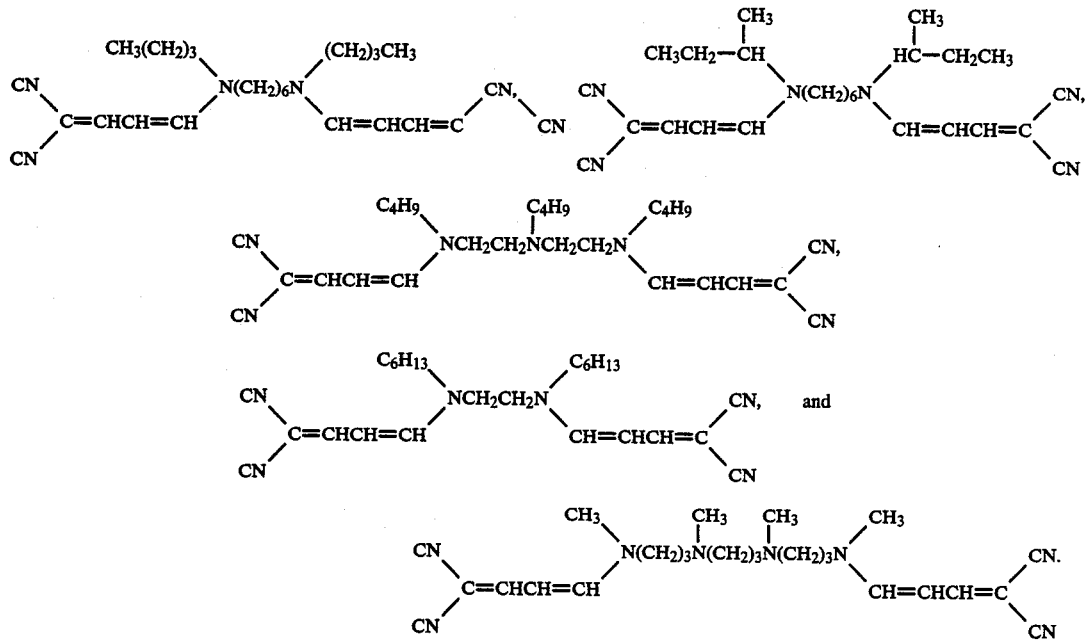

4. The element of claim 1 wherein X is selected from the group consisting of CN,

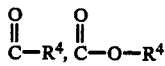

and SO₂R⁴ wherein R⁴ is alkyl or aryl.

5. The element of claim 4 wherein R⁴ is methyl or phenyl.

where
R³ is alkyl;
provided that the sum of the carbon atoms for both R¹ groups plus the R² group is at least 13; and
X is an electron withdrawing group.

9. The element of claim 8 wherein said photosensitive layer comprises poly(methyl methacrylate).

10. The element of claim 8 wherein said anti-reflective dye is selected from the group consisting of:

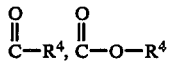

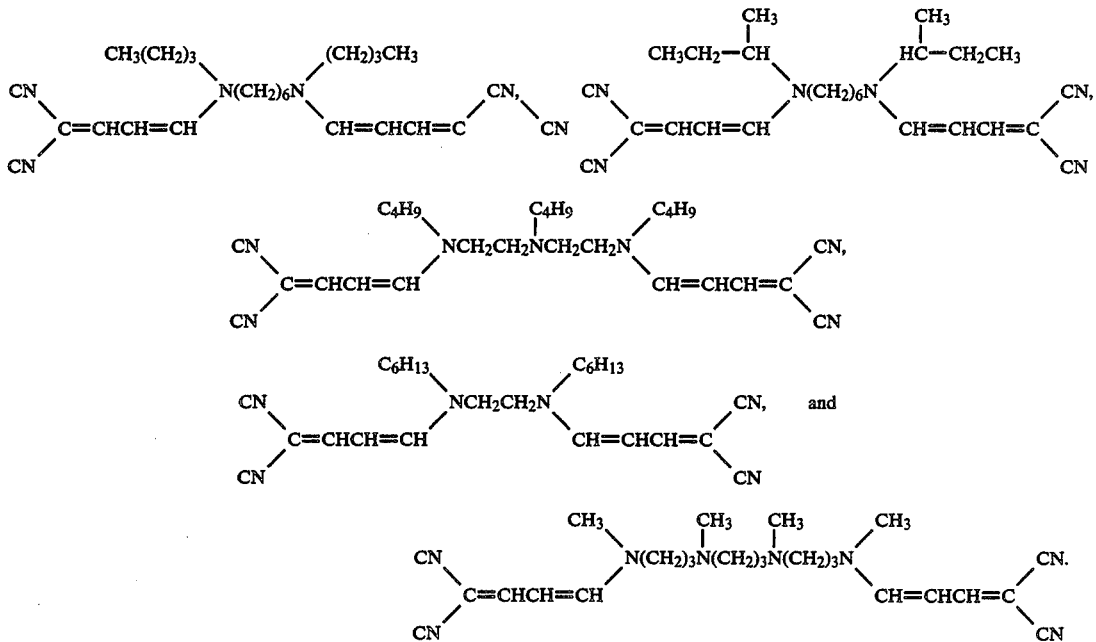

and $SO_2R^4$ wherein $R^4$ is alkyl or aryl.

12. The element of claim 8 wherein $R^4$ is methyl or phenyl.

13. The element of claim 8 wherein X represents CN.

14. The element of claim 8 wherein said photosensitive compound comprises a quinone diazide.

11. The element of claim 8 wherein X is selected from the group consisting of CN,